(12) United States Patent
Nguyen-Dinh et al.

(10) Patent No.: US 11,626,816 B2
(45) Date of Patent: Apr. 11, 2023

(54) INTEGRATED SELF-SUSTAINABLE POWER SUPPLY

(71) Applicant: CAIRDAC, Antony (FR)

(72) Inventors: An Nguyen-Dinh, La Riche (FR); Etienne Flesch, Andésy (FR); Igor Bimbaud, Mettray (FR); Bogdan Rosinski, Langeais (FR)

(73) Assignee: CAIRDAC, Antony (FR)

( * ) Notice: Subject to any disclaimer, the term of this patent is extended or adjusted under 35 U.S.C. 154(b) by 308 days.

(21) Appl. No.: 17/184,706

(22) Filed: Feb. 25, 2021

(65) Prior Publication Data
US 2021/0273587 A1 Sep. 2, 2021

(30) Foreign Application Priority Data
Mar. 2, 2020 (FR) ...................................... 20/02103

(51) Int. Cl.
*H02N 2/18* (2006.01)
(52) U.S. Cl.
CPC ............. *H02N 2/181* (2013.01); *H02N 2/186* (2013.01)
(58) Field of Classification Search
CPC .... H02N 2/181; H02N 2/186; H10N 30/2042; H10N 30/2043
See application file for complete search history.

(56) References Cited

U.S. PATENT DOCUMENTS

| | | | |
|---|---|---|---|
| 2013/0049539 A1* | 2/2013 | Lee | .......................... H03H 3/02 29/25.35 |
| 2017/0084815 A1 | 3/2017 | Choo et al. | |
| 2018/0053889 A1 | 2/2018 | Ghanbari et al. | |

FOREIGN PATENT DOCUMENTS

| | | | | |
|---|---|---|---|---|
| CN | 108075684 A | * | 5/2018 | ............. H02N 2/186 |
| WO | 2019/195264 A1 | | 10/2019 | |

OTHER PUBLICATIONS

Institut National De La Propriete Industrielle, French Search Report and Written Opinion issued in corresponding Application No. FR 2002103 dated Jun. 30, 2020.
European Patent Office, Extended European Search Report issued in corresponding Application No. EP 21 15 9068 dated May 19, 2021.

* cited by examiner

*Primary Examiner* — J. San Martin
(74) *Attorney, Agent, or Firm* — Stites & Harbison, PLLC; Jeffrey A. Haeberlin

(57) ABSTRACT

An integrated self-sustainable power supply includes a piezoelectric energy harvesting (PEH) beam, a power management unit (PMU) circuit located on the PEH beam, a rechargeable battery located on the PEH beam, and a positive regulated power supply output and a negative regulated power supply output. The PMU circuit includes electrical inputs/outputs. The rechargeable battery includes a negative access pad and a positive access pad, which are in electrical communication with the electrical inputs/outputs of the PMU circuit. The positive regulated power supply output and the negative regulated power supply output are also in electrical communication with the electrical inputs/outputs of the PMU circuit.

15 Claims, 7 Drawing Sheets

INTEGRATED SELF-SUSTAINABLE POWER SUPPLY

CROSS-REFERENCE TO RELATED APPLICATIONS

Not Applicable.

STATEMENT REGARDING FEDERALLY SPONSORED RESEARCH OR DEVELOPMENT

Not applicable.

THE NAMES TO PARTIES TO A JOINT RESEARCH AGREEMENT

Not applicable.

INCORPORATION-BY-REFERENCE OF MATERIAL SUBMITTED ON A COMPACT DISC

Not applicable.

FIELD OF THE INVENTION

This invention generally relates to an integrated self-sustainable power supply module that can be implemented as principal power source for medical implants, electronic devices, sensing systems, Internet of Things (IoT) devices, monitoring patches or apparatus, and or any kind of apparatus that required autonomous energy to operate. More specifically, the invention relates to a piezoelectric cantilever beam as an energy scavenger integrated with a rechargeable battery and a power management circuit to energizing an electronic system that needs to be wirelessly powered.

BACKGROUND OF THE INVENTION

FIG. 1 and FIG. 2 show two main types of Piezoelectric Energy Harvesting (PEH) power supply systems as found in the prior-art. FIG. 1 is a schematic diagram of a conventional PEH beam 10 that includes two piezoelectric layers 12, 14 (such as of lead zirconate titanate (PZT)) of equal thickness assembled on opposite main surfaces of a shim 16. The PEH beam 10 is then clamped at a first end 18 (i.e., a first major extremity) into structure 20 (i.e., a structure in which the PEH beam is mounted), forming a cantilever beam, and a second end 22 (i.e., a second, opposite major extremity) is mounted with a seismic mass 24 that makes the cantilever vibrate at a predetermined frequency. Directions X, Y and Z, respectively, correspond to references: along the beam length L, along the beam width W, and along the beam thickness T. The piezoelectric layers 12, 14 are assembled in the same or opposite polarity orientation and are plated with electrodes 26, 28 on their external main surfaces. The electrodes 26, 28 are electrically connected to a Power Management Unit (PMU) 30. In FIG. 2, the directions X, Y and Z remain unchanged and the PEH beam 10 is clamped at both the first end 18 and the second end 22 (opposite extremities). The seismic mass 24 is mounted at an equal distance between the first end 18 and the second end 22.

Common piezoelectric flexural multilayered or mono-morph energy harvesters operating in modes 31 (FIG. 3) or 33 (FIG. 4) are parallelized shapes and are of uniform design.

When subject to vibrations, the seismic mass 24 moves up and down in the direction of the Z axis and makes the PEH beam 10 bend (deflect) with an amplitude according to applied acceleration forces. The deflection of the PEH beam stresses the piezoelectric layers 12, 14 in opposite ways (traction/compression). Consequently, positive and negative electrical charges will respectively occur on the electrodes 26, 28 during bending cycles and will be harvested by the PMU 30 connected thereto. A rectifier 32 (FIG. 5) will enable the PMU 30 to collect the electrical energy produced, whatever its polarity, and to store the collected energy into a storage unit 34 (capacitor or battery).

Most applications require that the storage unit be a rechargeable battery, in order to ensure stability and reliability of the power supply system. Conventional systems so far utilize commercial or customized batteries that are factory-packaged and then assembled into the apparatus and connected to the harvesting components or other electronic components. This method is straightforward and simple in design, but far from optimized in terms of energy density for the battery and miniaturization for the device.

BRIEF SUMMARY OF THE INVENTION

In the present invention, a rechargeable battery and a PMU circuit are designed and manufactured as integrated subcomponents of PEH device in order to maximize its intrinsic performance, degree of miniaturization, and customization to suit individual applications, and to optimize manufacturing costs.

The present invention relates to multilayered, bimorph or mono-morph vibrating mechanical construction having one or several inner or outer composite "shim" or "beam" materials acting as a flexural mechanical spring. This structure also integrates solid state rechargeable battery modules that can be assembled on the PEH device as an added-on sub component or monolithically μ-fabricated onto the cantilever beam to obtain an integrated self-sustainable power supply module wherein no individual packing is required for either the rechargeable battery or the cantilever beam.

The embodiments of this invention are generally intended for being hermetically incorporated into the apparatus housing wherein the power supply module is secured and protected from external environment.

Generally described, an integrated self-sustainable power supply according to the invention includes: a piezoelectric energy harvesting (PEH) beam; a power management unit (PMU) circuit located on the PEH beam and including electrical inputs/outputs; a rechargeable battery located on the PEH beam and including a negative access pad and a positive access pad, the negative access pad and the positive access pad in electrical communication with the electrical inputs/outputs of the PMU circuit; and a positive regulated power supply output and a negative regulated power supply output in electrical communication with the electrical inputs/outputs of the PMU circuit.

According to one aspect of the invention, the PEH beam includes: a first piezoelectric layer; a second piezoelectric layer; a first piezoelectric layer electrode on the first piezoelectric layer; a second piezoelectric layer electrode on the second piezoelectric layer; an interposer on the first piezoelectric layer electrode, the interposer composed of an insulating material; and electrically conductive tracks positioned on the interposer. The PMU circuit is located on the interposer, and the electrical inputs/outputs are connected to the electrically conductive tracks. The rechargeable battery is located on the interposer, and the negative access pad and the positive access pad are connected to the electrically conductive tracks. The electrical inputs/outputs of the PMU circuit are operatively connected: to the positive access pad of the rechargeable battery and the negative access pad of the rechargeable battery through the electrically conductive tracks; to the first piezoelectric layer electrode; and to the second piezoelectric layer electrode.

In one implementation, the PEH beam further includes a shim having a parallelepiped form with a thickness dimension made smaller than a width dimension and a length dimension. The shim includes a first main surface, a second main surface opposite the first main surface, a proximal end, and a distal end opposite the proximal end. The first piezoelectric layer is laminated on the first main surface of the shim and has a first piezoelectric layer outer surface. The second piezoelectric layer is laminated on the second main surface of the shim and has a second piezoelectric layer outer surface. The first piezoelectric layer electrode has a first piezoelectric layer electrode outer surface. The second piezoelectric layer electrode is on the second piezoelectric layer outer surface. The interposer is laminated on the outer surface of the first piezoelectric layer electrode and has an interposer outer surface. The electrically conductive tracks are positioned on the interposer outer surface. The rechargeable battery is attached to the interposer outer surface. The PEH beam may further include an electrically conductive via through the interposer in a thickness direction and perpendicular to the interposer outer surface, and the electrical inputs/outputs of the PMU circuit and the first piezoelectric layer electrode may be connected through the electrically conductive via.

In one embodiment, the integrated self-sustainable power supply further includes an electrically conductive clamp, and the PEH beam has a proximal end extending into the electrically conductive clamp. In this embodiment, the electrical inputs/outputs of the PMU circuit operatively connected to the second piezoelectric layer electrode are connected through the clamp.

In another embodiment, the integrated self-sustainable power supply further includes an electrically non-conductive clamp, and the PEH beam has a proximal end extending into the electrically non-conductive clamp. In this embodiment, the electrical inputs/outputs of the PMU circuit operatively connected to the second piezoelectric layer electrode are connected through a flexible printed circuit providing electrical communication between the second piezoelectric layer electrode and the PMU circuit.

In yet another embodiment, the shim is composed of an electrically conductive material, the first piezoelectric layer has a first piezoelectric layer inner surface, and the second piezoelectric layer has a second piezoelectric layer inner surface. Thus, the first piezoelectric layer inner surface and the second piezoelectric layer inner surface are electrically connected together through the shim.

In another implementation, a clamp defines an opening therethrough, and the PEH beam has a proximal end extending into the clamp. The first piezoelectric layer has a first piezoelectric layer inner surface, and the first piezoelectric layer electrode is a first piezoelectric layer inner surface electrode on the first piezoelectric layer inner surface. The first piezoelectric layer inner surface electrode has a first piezoelectric layer inner surface electrode inner surface. The interposer is on the first piezoelectric layer inner surface electrode inner surface and has an interposer inner surface. The interposer includes a prolongation that extends through the opening in the clamp. The prolongation has the positive regulated power supply output and the negative regulated power supply output thereon. The electrically conductive tracks are positioned on the interposer inner surface. The second piezoelectric layer is in spaced relation with the first piezoelectric layer and has a second piezoelectric layer inner surface opposed to the first piezoelectric layer inner surface. The second piezoelectric layer inner surface electrode is on the second piezoelectric layer inner surface and has a second piezoelectric layer inner surface electrode inner surface. A spacer extends between the second piezoelectric layer inner surface electrode inner surface and the interposer inner surface, such that a cavity is defined by the second piezoelectric layer inner surface electrode inner surface, the interposer inner surface, and the spacer. The PMU circuit and the rechargeable battery are attached to the interposer inner surface. The rechargeable battery may a battery thickness and the spacer may have a spacer height, and the spacer height may be at least 120% of the battery thickness. The spacer may be comprised of pillars regularly placed on the entirety of the second piezoelectric layer inner surface electrode inner surface except in regions where the PMU circuit and the rechargeable battery are located. Alternatively, the spacer may be comprised of a bulk material having a cavity formed where the PMU circuit and the battery are located.

According to one aspect, the PEH beam further includes an electrically conductive via through the interposer in a thickness direction and perpendicular to the interposer inner surface, and a conductive leg extending between the interposer and the second piezoelectric layer inner surface electrode. In this embodiment, the electrical inputs/outputs of the PMU circuit and the first piezoelectric layer inner surface electrode are connected through the electrically conductive via, and the electrical inputs/outputs of the PMU circuit and the second piezoelectric layer electrode are connected through the conductive leg.

According to another aspect, the first piezoelectric layer may further have a first piezoelectric layer outer surface, the second piezoelectric layer may further have a second piezoelectric layer outer surface. Then, the integrated self-sustainable power supply may further include a first piezoelectric layer outer surface electrode on the first piezoelectric layer outer surface and a second piezoelectric layer outer surface electrode on the second piezoelectric layer outer surface.

In one embodiment, the clamp is electrically conductive, such that the first piezoelectric layer outer surface electrode and the second piezoelectric layer outer surface electrode are in electrical communication through the clamp.

In another embodiment, the clamp is electrically non-conductive. In this embodiment, a flexible printed circuit electrically connects the first piezoelectric layer outer surface electrode and the second piezoelectric layer outer surface electrode.

Other features and advantages of the invention will be set forth in, or apparent from, the detailed description of exemplary embodiments of the invention found below.

BRIEF DESCRIPTION OF THE DRAWINGS

Embodiment herein will hereinafter be described in conjunction with the appended drawings and illustrations provided to illustrate and not limit the scope of the claims:

DETAILED DESCRIPTION OF EXEMPLARY EMBODIMENTS OF THE INVENTION

Figure 1:
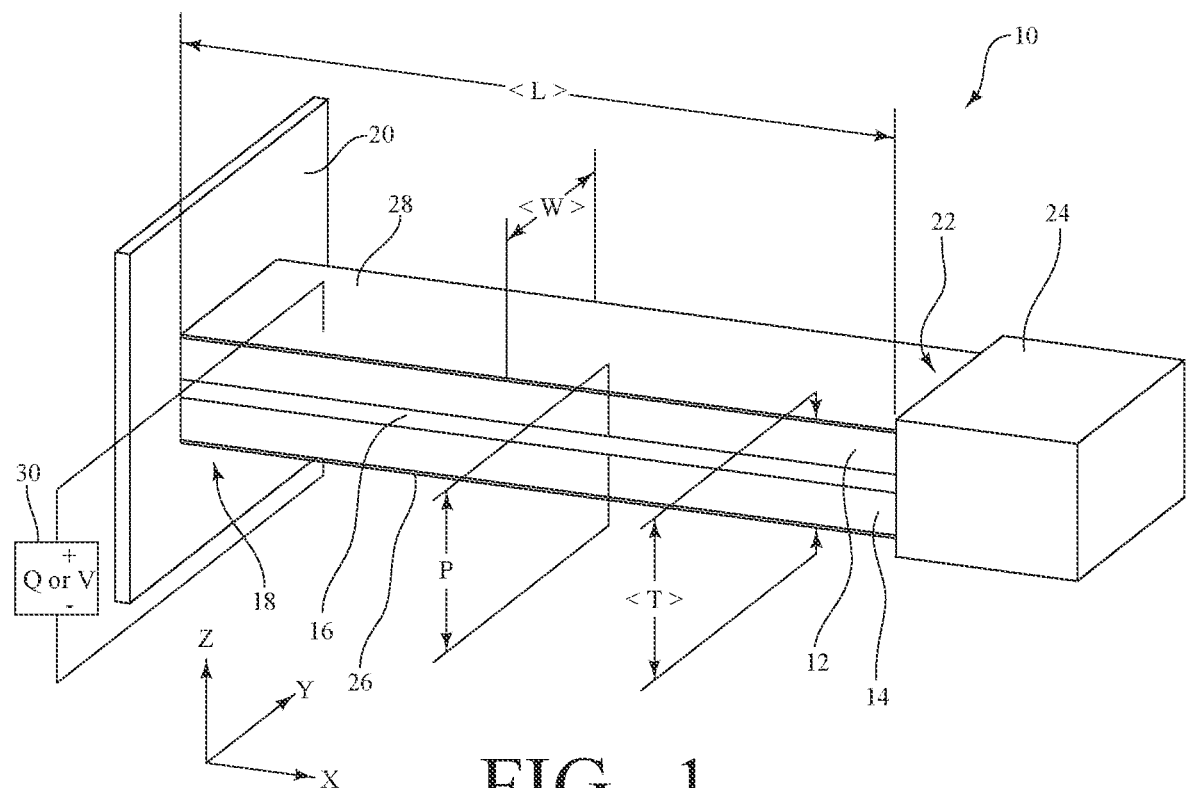
FIG. 1 is a perspective view of a conventional clamped free cantilever beam device.
Figure 2:
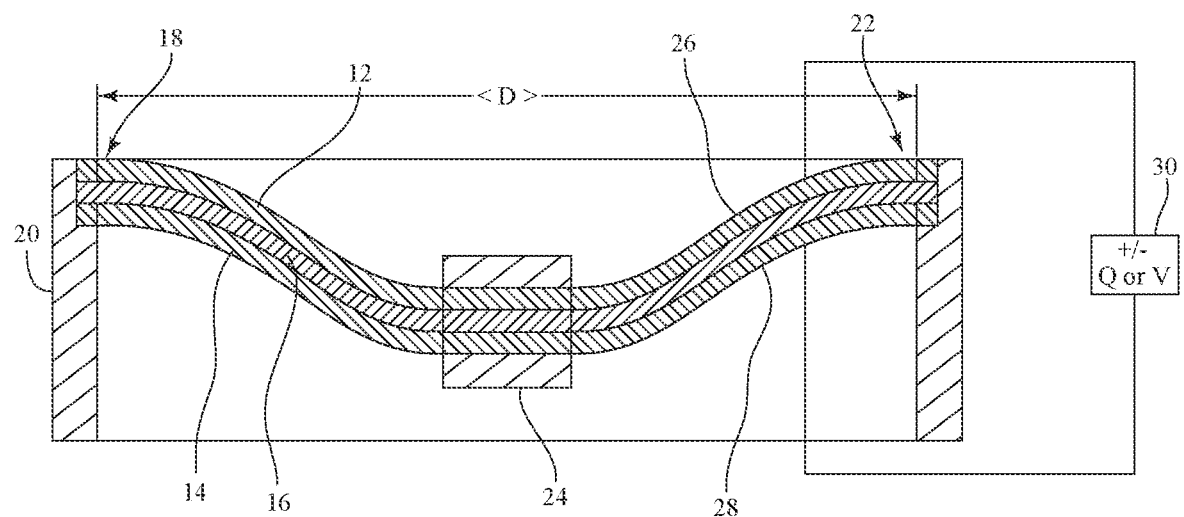
FIG. 2 is a sectional view of a classical clamped-clamped cantilever beam device.
Figure 3:
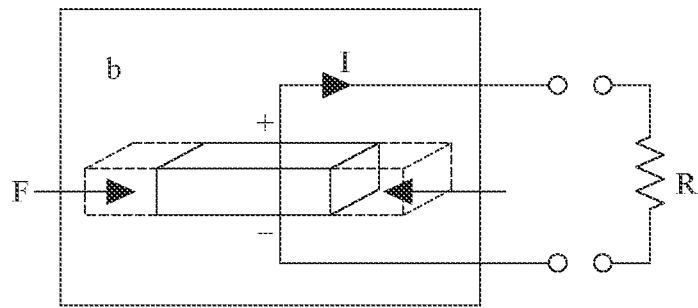
FIG. 3 is a schematic diagram of piezoelectric current generation in strain mode (d31).
Figure 4:
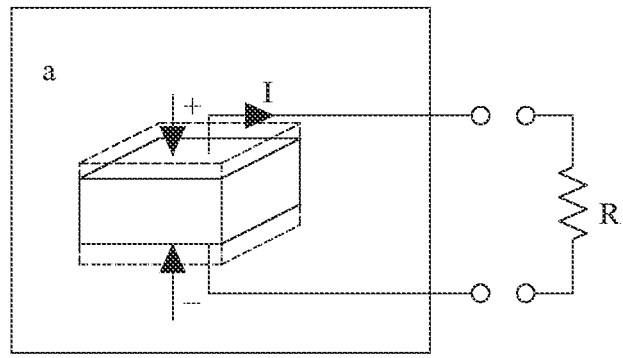
FIG. 4 is a schematic diagram of piezoelectric current generation in compression mode (d33).
Figure 5:
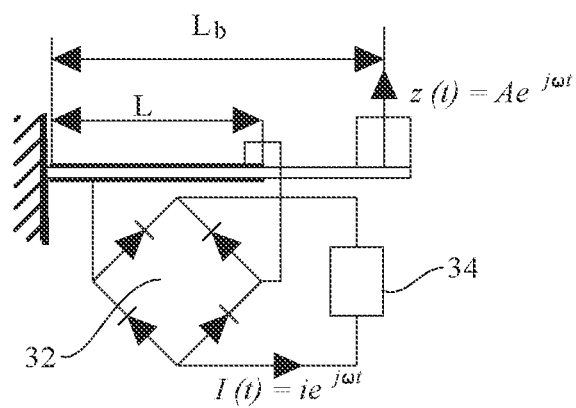
FIG. 5 is a schematic diagram of a cantilever beam device with a rectifier.

The details of one or more embodiments of the presently-disclosed subject matter are set forth in this document. Modifications to embodiments described in this document, and other embodiments, will be evident to those of ordinary skill in the art after a study of the information provided in this document. The information provided in this document, and particularly the specific details of the described exemplary embodiments, is provided primarily for clearness of understanding and no unnecessary limitations are to be understood therefrom. In case of conflict, the specification of this document, including definitions, will control.

While the following terms are believed to be well understood by one of ordinary skill in the art, definitions are set forth to facilitate explanation of the presently-disclosed subject matter.

Unless defined otherwise, all technical and scientific terms used herein have the same meaning as commonly understood by one of ordinary skill in the art to which the presently-disclosed subject matter belongs. Although any methods, devices, and materials similar or equivalent to those described herein can be used in the practice or testing of the presently-disclosed subject matter, representative methods, devices, and materials are now described.

Following long-standing patent law convention, the terms "a", "an", and "the" refer to "one or more" when used in this application, including the claims. Thus, for example, reference to "an electrical track" includes a plurality of such tracks, and so forth.

Unless otherwise indicated, all numbers expressing composition components, properties such as frequencies, and so forth used in the specification and claims are to be understood as being modified in all instances by the term "about." Accordingly, unless indicated to the contrary, the numerical parameters set forth in this specification and claims are approximations that can vary depending upon the desired properties sought to be obtained by the presently-disclosed subject matter.

As used herein, the term "about," when referring to a value or to an amount is meant to encompass variations of in some embodiments ±20%, in some embodiments ±10%, in some embodiments ±5%, in some embodiments ±1%, in some embodiments ±0.5%, and in some embodiments ±0.1% from the specified amount, as such variations are appropriate to perform the disclosed subject matter.

As used herein, ranges can be expressed as from "about" one particular value, and/or to "about" another particular value. It is also understood that there are a number of values disclosed herein, and that each value is also herein disclosed as "about" that particular value in addition to the value itself. For example, if the value "10" is disclosed, then "about 10" is also disclosed. It is also understood that each unit between two particular units are also disclosed. For example, if 10 and 15 are disclosed, then 11, 12, 13, and 14 are also disclosed.

As used herein, a "Power Management Unit (PMU) circuit" refers to a class of integrated circuits that perform various functions for power management, including battery management, voltage regulation, and charging functions. The PMU circuit may integrate a low-loss full-wave bridge rectifier with a high efficiency buck converter to form a complete energy harvesting solution optimized for high output impedance energy sources such as piezoelectric.

As used here, a "rechargeable battery" refers to a type of electrical battery which can be charged, discharged into a load, and recharged many times. It may also be referred to as a storage battery or a secondary cell. The rechargeable battery accumulates and stores energy through a reversible electrochemical reaction.

The present invention discloses several preferred embodiments to integrate a PMU circuit and a rechargeable battery with a Piezoelectric Energy Harvesting (PEH) beam. In the embodiments hereinafter described, the same orientation directions will be employed for the sake of clarity as indicated in FIG. 1: a longitudinal axis (X) along the beam length (L), a lateral axis (Y) along the beam width (W)—i.e. parallel to the main surfaces of the piezoelectric layers and perpendicular to the X-axis—and, a vertical axis (Z) along the beam thickness (T). X, X-axis, longitudinal direction or longitudinal axis refer to the same direction and will be indifferently employed hereinafter; as well as respectively for Y/lateral and Z/vertical.

Under ambient vibrations the PEH beam can theoretically oscillate according to several oscillation modes. But only the first longitudinal oscillation mode is preferred (i.e. at a given time, any points of the beam which are aligned parallel to the Y direction move with the same displacement direction and amplitude, and the displacement amplitude along the Z-axis of all points of the beam have the same orientation, positive or negative). This main oscillation mode has the lowest frequency and all the other vibration modes are often neglected considering that the beam length (L) is significantly higher than the beam width (W) and much higher than the beam thickness (T). Additionally, a Deformation Zone (DZ) is defined as the part of the beam which can freely bend to generate electricity. Typically, the DZ is the part of the beam between its clamping region and the seismic mass. The resonance frequency of the first oscillation mode of the PEH beam matches the ambient vibration frequency (typically from 1 Hz to 1 kHz). To that end, depending on the seismic mass weight (typically between 1 gram and 100 grams), the beam length typically ranges from a few millimeters to 200 millimeters. Depending on the system specifications, the seismic mass can also be omitted. For the clarity of the descriptions hereunder, the seismic mass will not be mentioned.

1. First Embodiment

Figure 6:
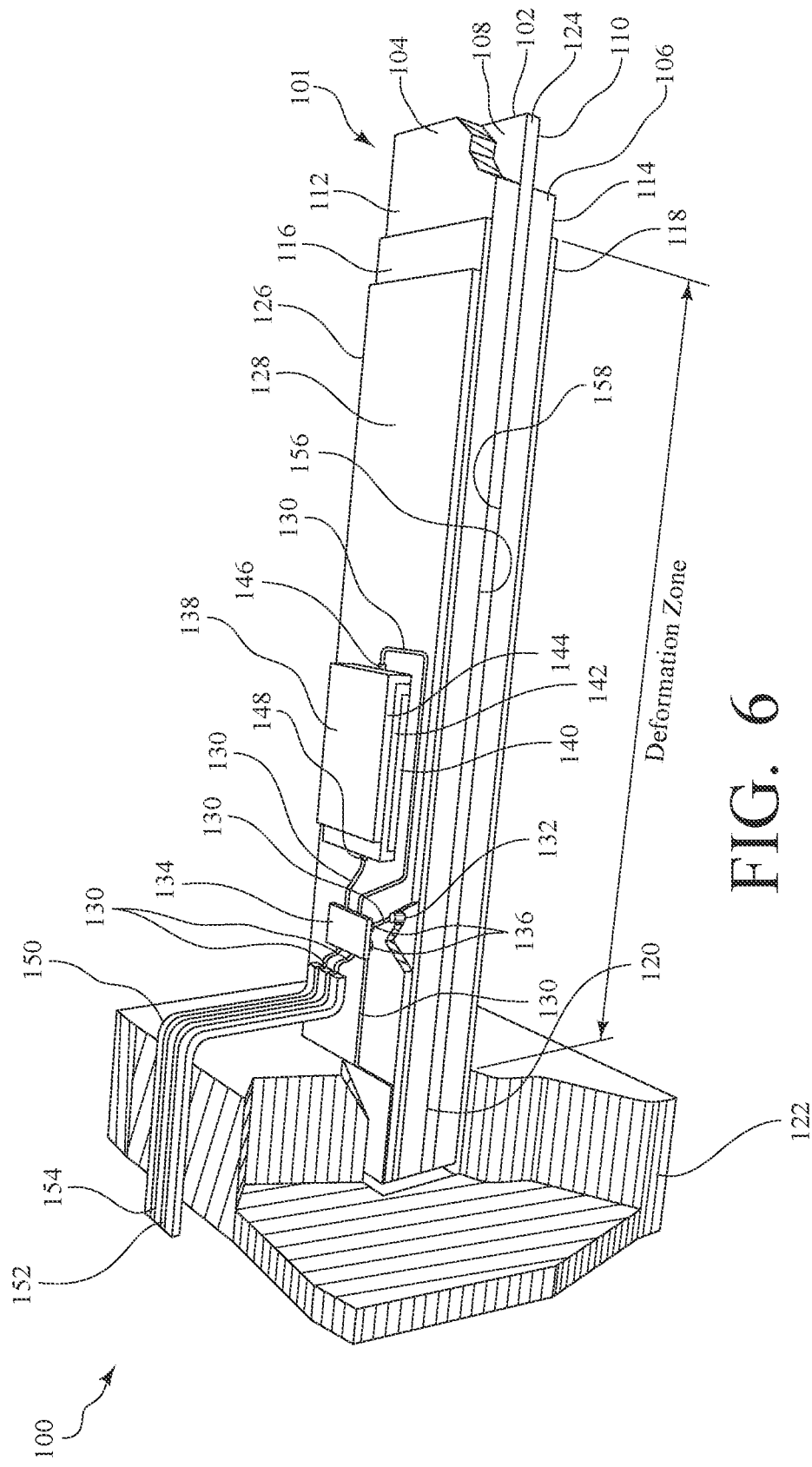
FIG. 6 is a perspective view with selected portions cut away of an exemplary embodiment of an integrated self-sustainable power supply according to the invention.

FIG. 6 is a perspective view of a first exemplary embodiment of an integrated self-sustainable power supply 100 according to the present invention, including a PEH beam 101 comprising a shim 102 sandwiched between a first piezoelectric layer 104 and a second piezoelectric layer 106. In one embodiment, the first piezoelectric layer 104 and the second piezoelectric layer 106 are symmetrically disposed with regard to the shim 102. The shim includes a first main surface 108 and a second main surface 110 opposite the first main surface. The first piezoelectric layer 104 is laminated on the first main surface 108 of the shim 102 and the second piezoelectric layer 106 is laminated on the second main surface 110 of the shim 102. The first piezoelectric layer 104 has a first piezoelectric layer outer surface 112 and the second piezoelectric layer 106 has a second piezoelectric layer outer surface 114. The first piezoelectric layer 104 has a first piezoelectric layer electrode 116 deposited on the first piezoelectric layer outer surface 112. The second piezoelectric layer 106 has a second piezoelectric layer electrode 118 deposited on the second piezoelectric layer outer surface 114.

The shim 102 is preferably as thin as possible in order to maximize a piezoelectric material ratio of the device while maintaining a total thickness in reasonable proportions. To facilitate the fabrication process, the thickness of the shim 102 is typically within 2-20 μm and preferably under ten (10) micrometers. The piezoelectric layers 104, 106 typically have the same thicknesses to maintain a neutral fiber (all the points of the beam materials which are not submitted to longitudinal dilatation or compression during bending of the beam) within the thickness of the shim 102. The thickness of the piezoelectric layers 104, 106 is defined based on the working frequency and power considerations. For a typical frequency range (from few Hertz to few hundreds of Hertz), the minimum thicknesses are typically around few micrometers, and maximum thicknesses are up to few hundreds of micrometers. The energy conversion yield reaches a maximum for a given thickness. The determination of the optimal thickness often require preliminary model calculations. Typically, for one hundred Hertz vibration frequency, the optimal thickness for the piezoelectric layers is eighty (80) micrometers.

The material of the shim 102 is electrically conductive. In order to withstand the applied curvature without damage, the electrically conductive material of the shim 102 is brass or any other material selected from the group of metals, organics, or inorganics and having desired Young's modulus values preferably in the range from dozens of GPa to hundreds of GPa.

The material of the first piezoelectric layer 104 and the second piezoelectric layer 106, is typically lead zirconate titanate (PZT) or any other material exhibiting piezoelectric properties.

In particular, the shim 102 has a proximal end 120 which extends into and is connected to an anchor or clamp 122. The material of the clamp 122 is preferably a metallic material such as Copper, Aluminium, Tungsten, or any organic or inorganic material exhibiting a Young modulus over 50 GPa. The clamp 122 is preferably electrically conductive, as discussed below. The shim 102 has a distal end 124 opposite to the proximal end where a seismic mass is attached (not shown in FIG. 6, but see FIG. 1).

An interposer 126 is laminated on an outer surface of the first piezoelectric layer electrode 116. The interposer 126 is made of an electrically insulating material having soft mechanical properties, such as polyimide. The thickness of the interposer 126 is typically 25 μm. An outer surface 128 of the interposer 126 comprises several electrically conductive tracks 130 parallel to the interposer outer surface 128, and at least one electrically conductive via 132 perpendicular to the interposer outer surface 128. The electrically conductive tracks 130 connect subcomponents and harvester electrodes, as discussed below.

The interposer 126 is obtained thanks to existing flexible printed circuit board manufacturing processes. In this exemplary embodiment, the interposer 126 is composed of only one insulating layer with electrical tracks either isolated or connected to each other. However, a multi-layer structure of alternate insulating/conductive layers with vertical vias is within the scope of this disclosure depending on the complexity of the electrical interconnection between the sub components.

A PMU circuit 134 has electrical inputs/outputs 136. The electrical inputs/outputs 136 of the PMU circuit 134 are mechanically and electrically connected to the conductive tracks 130 through, e.g., a soldering process or an adhesive conductive film or glue. The PMU circuit 134 comprises at least four electrical input/outputs (2 leads for the input from the harvester and 2 output leads) but additional input/outputs are necessary for the battery connection and other circuit control. For example, the LTC3588 from Analog Devices (Norwood, Mass., USA) has 10 inputs/outputs and is packaged in a 10-lead DFN case with suitable dimensions ($3\times3\times1$ mm$^3$).

The PMU circuit 134 can be placed anywhere on the interposer outer surface 128 within the Deformation Zone, if such circuit minimally interferes with the beam deformation. In one embodiment, the PMU circuit 134 is a bare silicon die circuit with lateral dimensions under few millimeters. In one embodiment, the PMU circuit 134 is placed close to the clamp 122, where the PEH beam 101 deformations are minimal to avoid possible wear due to mechanical stress. In another embodiment, the PMU circuit 134 slightly interferes with the displacement of the PEH beam 101 due its dimensions or rigidity—e.g. a circuit packaged in a case—so the PMU circuit 134 is placed outside the Deformation Zone.

A battery 138 is also attached to the interposer 126. In one embodiment, the battery 138 has a thin-film structure mainly composed of a first positive electrode 140, an electrolyte layer 142, and a negative electrode 144. The negative electrode 144 is electrically connected to a negative access pad 146 outside the battery 138. The positive electrodes 140 is electrically connected to a positive access pad 148. Both the negative access pad 146 and the positive access pad 148 are electrically bonded to the electrically conductive tracks 130 of the interposer 126. In different embodiments the battery 138 is an ultra-thin solid state battery, a laminar polymer battery, a printed battery, or another thin-film battery with low mechanical rigidity to accommodate the beam deformation. The battery 138 is attached to the outer surface 128 of the interposer 126 by, e.g., adhesive tape or glue. In different embodiments, the battery 138 covers part or all of the available surface of the interposer 126 within or outside the Deformation Zone. In other embodiments, a rigid battery covers the available surface of the interposer 126 outside the Deformation Zone.

Figure 7:
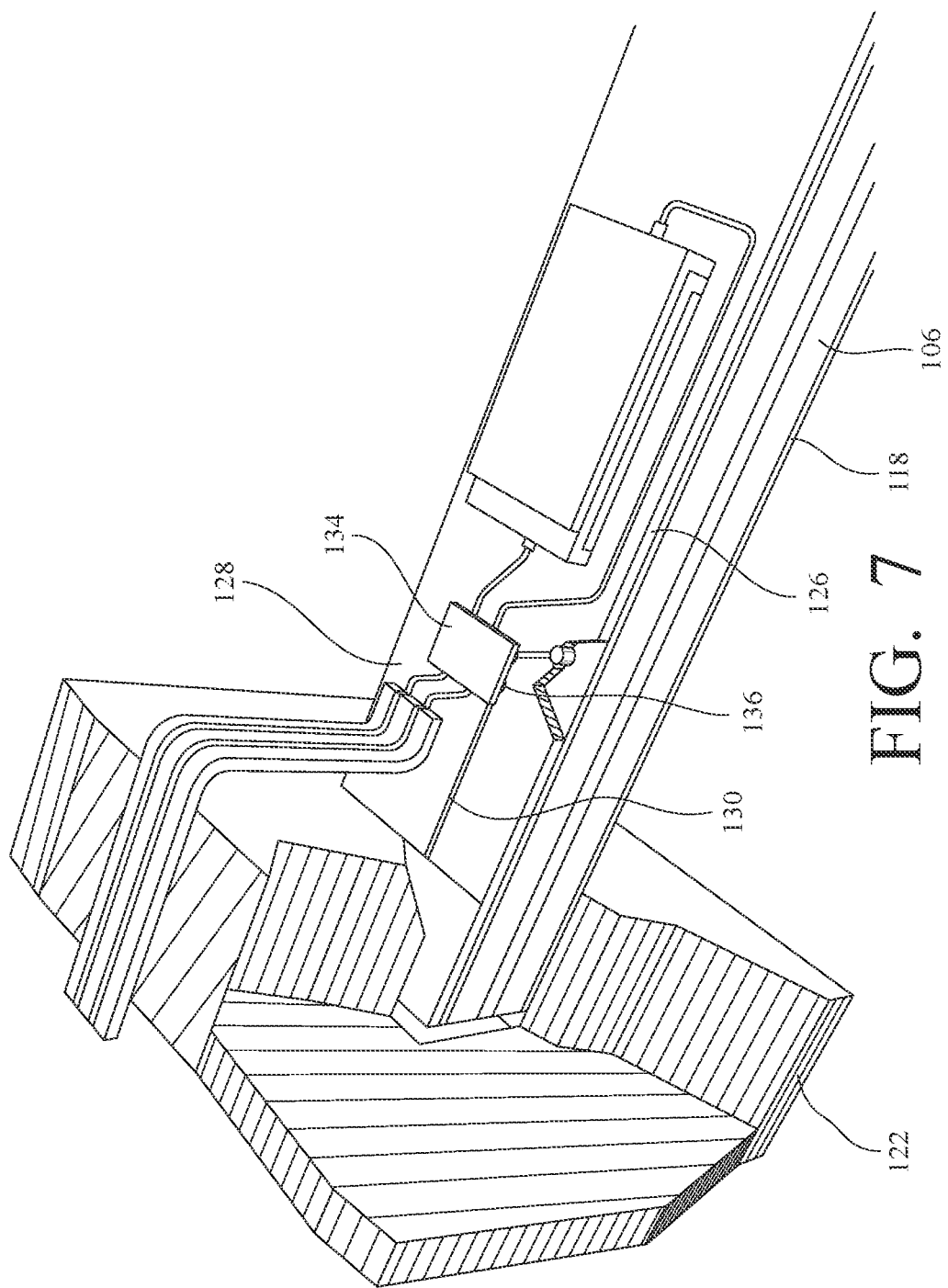
FIG. 7 is a perspective view of a first exemplary embodiment detailing an exemplary electrical connection with the lower electrode.

Now considering the electrical connections of the exemplary embodiment, the electrical inputs/outputs 136 of the PMU circuit 134 are connected:

a.) to the positive access pad 148 of the battery 138, and to the negative access pad 146 of the battery 138 through separate electrical tracks 130 on the outer surface 128 of the interposer 126;

b.) to the first piezoelectric layer electrode 116 of the first piezoelectric layer 104 through the electrically conductive via 132 and an electrical track 130 on the outer surface 128 of the interposer 126;

c.) to the second piezoelectric layer electrode 118 of the second piezoelectric layer 106 through the electrically conductive clamp 122, and an electrical track 130 on the outer surface 128 of the interposer 126 towards one input 136 of the PMU circuit 134. This is shown in more detail in FIG. 7.

d.) Two regulated power supply outputs from the PMU circuit 134 are electrically connected to two separate conductive tracks 130 on the outer surface 128 of the interposer 126, which are electrically connected to a positive track 152 and a negative track 154 on a flexible printed circuit board 150. These tracks 152, 154 are the main outputs of the present invention which can then be further connected to user's device.

Figure 8:
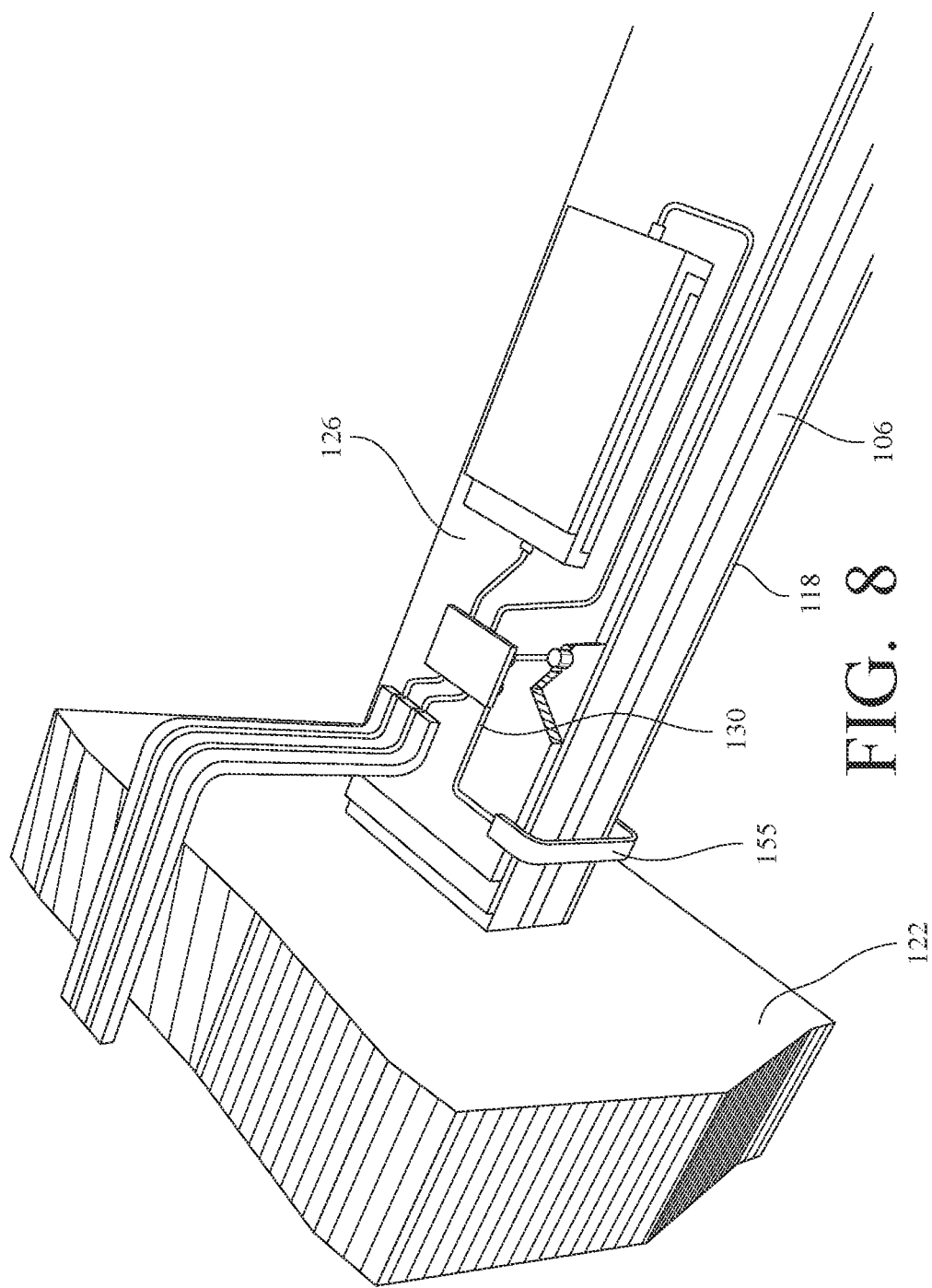
FIG. 8 is a perspective view of a first exemplary embodiment detailing another exemplary electrical connection with the lower electrode.

In an alternate embodiment shown in FIG. 8, the clamp 122 is not electrically conductive and the second piezoelectric layer electrode 118 of the second piezoelectric layer 106 is connected to an electrical track 130 of the interposer 126 with another flexible printed circuit 155 extending between the second piezoelectric layer electrode 118 and the interposer 126.

It is otherwise noted that the first piezoelectric layer 104 has a first piezoelectric layer inner surface 156 and the second piezoelectric layer 106 has a second piezoelectric layer inner surface 158. The first piezoelectric layer inner surface 156 and the second piezoelectric layer inner surface 158 are electrically connected together through the shim 102.

2. Second Embodiment

Figure 9:
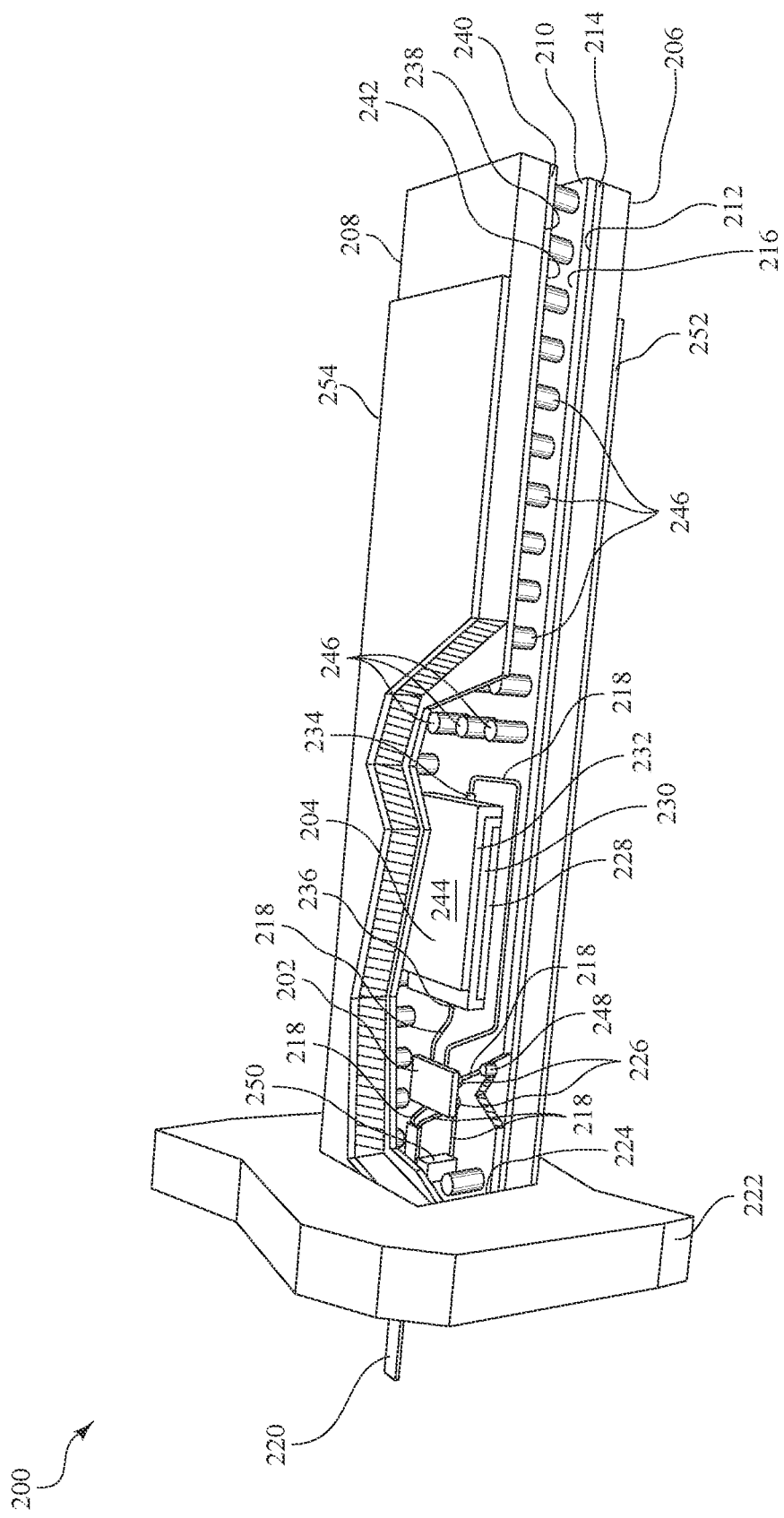
FIG. 9 is a perspective view of another exemplary integrated self-sustainable power supply according to the invention.

Now referring to FIG. 9, a perspective view of a second exemplary embodiment of an integrated self-sustainable power supply 200 according to the invention is shown, wherein a PMU circuit 202 and a battery 204 are now placed between a first piezoelectric layer 206 and a second piezoelectric layer 208. This embodiment is particularly advantageous to protect these subcomponents from the outside of the power supply 200 (i.e., a piezoelectric energy harvester device) as these subcomponents are embedded within the power supply 200 (piezoelectric energy harvester device). Furthermore, this embodiment takes into account thickness variations of the battery 204. Such variations are a well-known phenomenon for thin-film batteries. As the state of the charge of the battery increases, ionic components accumulate on electrodes of the battery and yield to a thickness increase.

In this embodiment an interposer 210 is attached to an inner surface 212 of an electrode 214 of the first piezoelectric layer 206. The interposer 210 is composed of an insulating material—e.g. polyimide—and has an inner surface 216. Electrically conductive tracks 218 are positioned on the inner surface 216. The interposer 210 has the same general length and width dimensions and shape as the first piezo electric layer 206, but includes a prolongation 220 towards a clamp 222 and through an opening 224 defined by the clamp 222 through which the first piezoelectric layer 206 and the second piezoelectric layer 208 protrude. In some embodiments, the width dimension of the prolongation 220 is less than the width dimension of the first piezoelectric layer 206. In other embodiments, the width dimension of the prolongation 220 is equal to the width dimension of the first piezoelectric layer 206.

The PMU circuit 202 includes electrical inputs/outputs 226. In different embodiments, the electrical inputs/outputs 226 are electrically connected to the conductive tracks 218 through solder, adhesive conductive film, or glue. The PMU circuit 202 can be placed anywhere on the interposer inner surface 216 either within the Deformation Zone, if such circuit minimally interferes with the beam deformation, or outside of the Deformation Zone. In one embodiment, the PMU circuit 202 is a bare silicon die circuit with lateral dimensions under few millimeters is a good candidate. In one embodiment, the PMU circuit 202 is placed close to the conductive clamp 222 where the beam deformations are minimal to avoid possible wear due to mechanical stress. Nevertheless, for a same X position, the PMU circuit 202 will be less subject to mechanical stress than the first embodiment abovementioned, since it is closer to the neutral fiber of the whole harvester structure. As used herein, the terms "inner" and "outer" are defined with respect to the neutral fiber, with "inner" being closer to the neutral fiber and "outer" being further from the neutral fiber. In another embodiment, the PMU circuit 202 slightly interferes with the beam displacement due its dimensions or rigidity—e.g. a circuit packaged in a case. In that case, the PMU circuit 202 is placed outside the Deformation Zone.

The battery 204 is also attached to the interposer 210. In one embodiment, the battery 204 has a thin-film structure mainly composed of a first positive electrode 228, an electrolyte layer 230, and a negative electrode 232. The negative electrode 232 is electrically connected to a negative access pad 234 outside the battery 204. The positive electrode 228 is electrically connected to a positive access pad 236. Both the negative access pad 234 and the positive access pad 236 are electrically bonded to the electrically conductive tracks 218 of the interposer 210. In different embodiments, the technology of the battery 204 is a thin-film battery technology with low mechanical rigidity to accommodate the beam deformation. In different embodiments, battery 204 is attached to the inner surface 216 of the interposer 210 by adhesive tape or glue.

The second piezoelectric layer 208 has an inner surface 238. An electrode 240 is deposited on the inner surface 238 of the second piezoelectric layer 208. The second piezoelectric layer inner surface electrode 240 has an inner surface 242. An empty cavity is formed between the inner surface 242 of the second piezoelectric layer electrode 240 and an inner surface 244 of the battery 204 facing the second piezoelectric layer inner surface electrode 240. This cavity is intended to accommodate the thickness variations of the battery 204. In one embodiment, the height of the cavity is 20% of the thickness of the battery 204. For example, for a 100 μm thick battery, the cavity should be around 20 μm.

The cavity is obtained by inserting a spacer between the inner surface 242 of the second piezoelectric layer inner surface electrode 240 and the inner surface 216 of the interposer 210. In one embodiment, the spacer height is at least about 20% more than the thickness of the battery 204. For example, for a 100 μm battery, the spacer height is at least about 120 μm. In order to keep a proper flexibility of the beam, the tensile strength of the spacer should be ideally high in the Z direction and low in the X direction. In a particularly interesting embodiment, the spacer is comprised of pillars 246 regularly placed on the entirety of the inner surface 242 of the second piezoelectric layer inner surface electrode 240 except in the regions wherein the battery 204 and the PMU circuit 202 are located. Hence the battery 204 and the PMU circuit 202 are centered in the lateral dimension of the beam in order to keep symmetry or the pillars in the lateral dimension. The battery 204 and the PMU circuit 202 are placed anywhere within the Deformation Zone in the longitudinal dimension of the beam. In different embodiments, the sectional shape of the pillars 246 is square, rectangular or circular and the lateral dimensions of the pillars 246 is from 50 µm to 300 µm. A bulk spacer with open cavities at the location of the PMU circuit 202 and the battery 204 is also within the scope of this disclosure. In one embodiment, the pillars 246 are obtained by a subtractive process in which a bulk layer of the pillar material is attached to the inner surface 242 of the second piezoelectric layer inner surface electrode 240, the material is removed in-between the pillars 246 and in the regions where the battery 204 and the PMU circuit 202 are placed by a process of etching, dicing or milling. In one embodiment, the distance between two adjacent pillars is from 50 µm to three (3) millimeters. In one embodiment, the material of the pillars is metal or organic compatible with the abovementioned manufacturing processes.

Now considering the electrical connections of the present embodiment, the electrical inputs/outputs 226 of the PMU circuit 202 are connected:

a.) to the positive access pad 236 of the battery 204, and to the negative access pad 234 of the battery 204 through separate electrical tracks 218 on the inner surface 216 of the interposer 210;

b.) to the electrode 214 of the first piezoelectric layer 206 through an electrical via 248 and an electrical track 218 on the inner surface 216 of the interposer 210;

c.) to the second piezoelectric layer inner surface electrode 240 through a conductive leg 250 and an electrical track 218 on the inner surface 216 of the interposer 210;

d.) Two regulated power supply outputs from the PMU circuit 202 are electrically connected to two separate conductive tracks 218 on the inner surface 216 of the interposer 210 along the prolongation 220 through the opening 224 defined by the conductive clamp 222.

Figure 10:
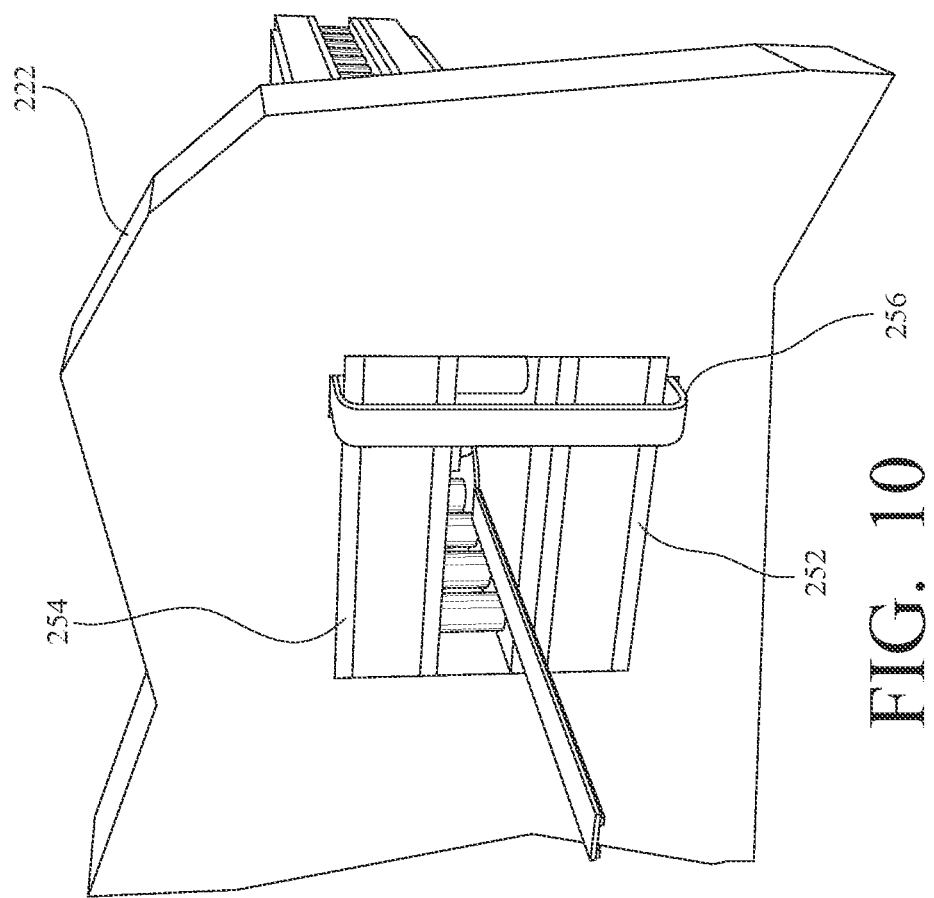
FIG. 10 is different perspective view of the exemplary integrated self-sustainable power supply of FIG. 9, shown in a configuration where the clamp is not electrically conductive.

It is otherwise noted that an outer electrode 252 of the first piezoelectric layer 206 and an outer electrode 254 of the second piezoelectric layer 208 are electrically connected together. In one embodiment, the clamp 222 is electrically conductive and in electrical contact with the outer electrode 252 of the first piezoelectric layer 206 and the outer electrode 254 of the second piezoelectric layer 208. In another embodiment, shown in FIG. 10, the clamp 222 is not electrically conductive, and the outer electrode 252 of the first piezoelectric layer 206 and the outer electrode 254 of the second piezoelectric layer 208 are electrically connected with a flexible printed circuit 256.

What is claimed is:

1. An integrated self-sustainable power supply comprising:
   a piezoelectric energy harvesting (PEH) beam;
   a power management unit (PMU) circuit located on the PEH beam and including electrical inputs/outputs;
   a rechargeable battery located on the PEH beam and including a negative access pad and a positive access pad, the negative access pad and the positive access pad in electrical communication with the electrical inputs/outputs of the PMU circuit; and
   a positive regulated power supply output and a negative regulated power supply output in electrical communication with the electrical inputs/outputs of the PMU circuit.

2. The integrated self-sustainable power supply of claim 1,
   wherein the PEH beam includes:
   a first piezoelectric layer;
   a second piezoelectric layer;
   a first piezoelectric layer electrode on the first piezoelectric layer;
   a second piezoelectric layer electrode on the second piezoelectric layer;
   an interposer on the first piezoelectric layer electrode, the interposer composed of an insulating material; and
   electrically conductive tracks positioned on the interposer;
   wherein the PMU circuit is located on the interposer, and the electrical inputs/outputs are connected to the electrically conductive tracks; and
   wherein the rechargeable battery is located on the interposer, and the negative access pad and the positive access pad are connected to the electrically conductive tracks;
   wherein the electrical inputs/outputs of the PMU circuit are operatively connected:
   to the positive access pad of the rechargeable battery and the negative access pad of the rechargeable battery through the electrically conductive tracks;
   to the first piezoelectric layer electrode; and
   to the second piezoelectric layer electrode.

3. The integrated self-sustainable power supply of claim 2,
   wherein the PEH beam further includes a shim having a parallelepiped form with a thickness dimension made smaller than a width dimension and a length dimension, and including a first main surface, a second main surface opposite the first main surface, a proximal end, and a distal end opposite the proximal end;
   wherein the first piezoelectric layer is laminated on the first main surface of the shim and has a first piezoelectric layer outer surface;
   wherein the second piezoelectric layer is laminated on the second main surface of the shim and has a second piezoelectric layer outer surface;
   wherein the first piezoelectric layer electrode has a first piezoelectric layer electrode outer surface;
   wherein the second piezoelectric layer electrode is on the second piezoelectric layer outer surface;
   wherein the interposer is laminated on the outer surface of the first piezoelectric layer electrode and has an interposer outer surface,
   wherein the electrically conductive tracks are positioned on the interposer outer surface; and
   wherein the rechargeable battery is attached to the interposer outer surface.

4. The integrated self-sustainable power supply of claim 3,
   wherein the PEH beam further comprises an electrically conductive via through the interposer in a thickness direction and perpendicular to the interposer outer surface; and
   wherein the electrical inputs/outputs of the PMU circuit and the first piezoelectric layer electrode are connected through the electrically conductive via.

5. The integrated self-sustainable power supply of claim 4, further comprising an electrically conductive clamp;
   wherein the PEH beam has a proximal end extending into the electrically conductive clamp;
   wherein the electrical inputs/outputs of the PMU circuit operatively connected to the second piezoelectric layer electrode are connected through the clamp.

6. The integrated self-sustainable power supply of claim 4, further comprising an electrically non-conductive clamp;
  wherein the PEH beam has a proximal end extending into the electrically non-conductive clamp;
  wherein the electrical inputs/outputs of the PMU circuit operatively connected to the second piezoelectric layer electrode are connected through a flexible printed circuit providing electrical communication between the second piezoelectric layer electrode and the PMU circuit.

7. The integrated self-sustainable power supply of claim 4,
  wherein the first piezoelectric layer has a first piezoelectric layer inner surface and the second piezoelectric layer has a second piezoelectric layer inner surface; and
  wherein the shim is composed of an electrically conductive material, such that the first piezoelectric layer inner surface and the second piezoelectric layer inner surface are electrically connected together through the shim.

8. The integrated self-sustainable power supply of claim 2,
  further comprising a clamp defining an opening therethrough;
  wherein the PEH beam has a proximal end extending into the clamp;
  wherein the first piezoelectric layer has a first piezoelectric layer inner surface;
  wherein the first piezoelectric layer electrode is a first piezoelectric layer inner surface electrode on the first piezoelectric layer inner surface, the first piezoelectric layer inner surface electrode having a first piezoelectric layer inner surface electrode inner surface;
  wherein the interposer is on the first piezoelectric layer inner surface electrode inner surface and has an interposer inner surface, the interposer including a prolongation extending through the opening in the clamp, the prolongation having the positive regulated power supply output and the negative regulated power supply output thereon;
  wherein the electrically conductive tracks are positioned on the interposer inner surface;
  wherein the second piezoelectric layer is in spaced relation with the first piezoelectric layer and has a second piezoelectric layer inner surface opposed to the first piezoelectric layer inner surface;
  wherein the second piezoelectric layer inner surface electrode is on the second piezoelectric layer inner surface and has a second piezoelectric layer inner surface electrode inner surface;
  further comprising a spacer extending between the second piezoelectric layer inner surface electrode inner surface and the interposer inner surface, such that a cavity is defined by the second piezoelectric layer inner surface electrode inner surface, the interposer inner surface, and the spacer;
  wherein the PMU circuit and the rechargeable battery are attached to the interposer inner surface.

9. The integrated self-sustainable power supply of claim 8,
  wherein the rechargeable battery has a battery thickness and the spacer has a spacer height,
  wherein the spacer height is at least 120% of the battery thickness.

10. The integrated self-sustainable power supply of claim 9, wherein the spacer is comprised of pillars regularly placed on the entirety of the second piezoelectric layer inner surface electrode inner surface except in regions where the PMU circuit and the battery are located.

11. The integrated self-sustainable power supply of claim 9, wherein the spacer is comprised of a bulk material having a cavity formed where the PMU circuit and the battery are located.

12. The integrated self-sustainable power supply of claim 8,
  wherein the PEH beam further comprises an electrically conductive via through the interposer in a thickness direction and perpendicular to the interposer inner surface, and a conductive leg extending between the interposer and the second piezoelectric layer inner surface electrode;
  wherein the electrical inputs/outputs of the PMU circuit and the first piezoelectric layer inner surface electrode are connected through the electrically conductive via; and
  wherein the electrical inputs/outputs of the PMU circuit and the second piezoelectric layer electrode are connected through the conductive leg.

13. The integrated self-sustainable power supply of claim 12,
  wherein the first piezoelectric layer further has a first piezoelectric layer outer surface;
  wherein the second piezoelectric layer further has a second piezoelectric layer outer surface;
  further comprising a first piezoelectric layer outer surface electrode on the first piezoelectric layer outer surface and a second piezoelectric layer outer surface electrode on the second piezoelectric layer outer surface.

14. The integrated self-sustainable power supply of claim 13,
  wherein the clamp is electrically conductive, such that the first piezoelectric layer outer surface electrode and the second piezoelectric layer outer surface electrode are in electrical communication through the clamp.

15. The integrated self-sustainable power supply of claim 13,
  wherein the clamp is electrically non-conductive;
  further comprising a flexible printed circuit electrically connecting the first piezoelectric layer outer surface electrode and the second piezoelectric layer outer surface electrode.

* * * * *